(12) United States Patent
Ali

(10) Patent No.: US 7,746,171 B2
(45) Date of Patent: Jun. 29, 2010

(54) AMPLIFIER NETWORKS WITH CONTROLLED COMMON-MODE LEVEL AND CONVERTER SYSTEMS FOR USE THEREWITH

(75) Inventor: Ahmed Mohamed Abdelatty Ali, Oak Ridge, NC (US)

(73) Assignee: Analog Devices, Inc., Norwood, MA (US)

( * ) Notice: Subject to any disclaimer, the term of this patent is extended or adjusted under 35 U.S.C. 154(b) by 67 days.

(21) Appl. No.: 12/220,558

(22) Filed: Jul. 25, 2008

(65) Prior Publication Data

US 2010/0019946 A1  Jan. 28, 2010

(51) Int. Cl.
*H03F 3/45* (2006.01)
(52) U.S. Cl. .............. 330/259; 330/258; 330/253; 330/290
(58) Field of Classification Search ......... 330/258–260, 330/253, 290
See application file for complete search history.

(56) References Cited

U.S. PATENT DOCUMENTS

| | | | |
|---|---|---|---|
| 5,838,199 A * | 11/1998 | Nakamura | 330/258 |
| 5,838,200 A | 11/1998 | Opris | 330/258 |
| 5,847,601 A | 12/1998 | Wang | 330/9 |
| 5,914,638 A | 6/1999 | He | 330/258 |
| 6,570,519 B1 | 5/2003 | Yang | 341/143 |
| 6,577,184 B2 | 6/2003 | Kwan et al. | 330/9 |
| 6,812,784 B2 | 11/2004 | Michalski | 330/9 |
| 6,888,407 B2 | 5/2005 | Ramazan et al. | 330/258 |
| 6,940,348 B2 | 9/2005 | Confalonieri et al. | 330/69 |
| 6,965,268 B2 | 11/2005 | Dyer et al. | 330/258 |
| 7,084,674 B1 | 8/2006 | Nairn | 327/67 |
| 7,154,334 B2 | 12/2006 | Dyer et al. | 330/258 |
| 2007/0024368 A1 | 2/2007 | Abdelatty Ali | |

* cited by examiner

*Primary Examiner*—Jean B Jeanglaude
(74) *Attorney, Agent, or Firm*—Koppel, Patrick, Heybl & Dawson

(57) ABSTRACT

Effective control of the common-mode level of amplifiers is obtained through control structures (both closed-loop and open-loop structures) which are directed to various amplifier functions such as the reduction of amplifier loading, accurate sensing of common-mode levels, mitigation of headroom restraints, and proper transistor biasing. This common-mode control is especially useful in multiplying analog-to-digital converters (MDACs) of signal processing systems.

19 Claims, 6 Drawing Sheets

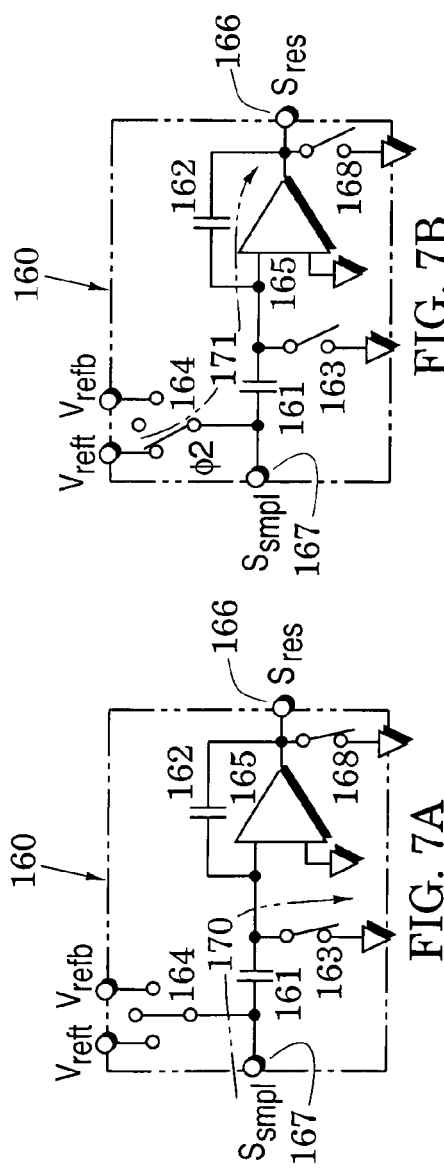
FIG. 7A
FIG. 7B
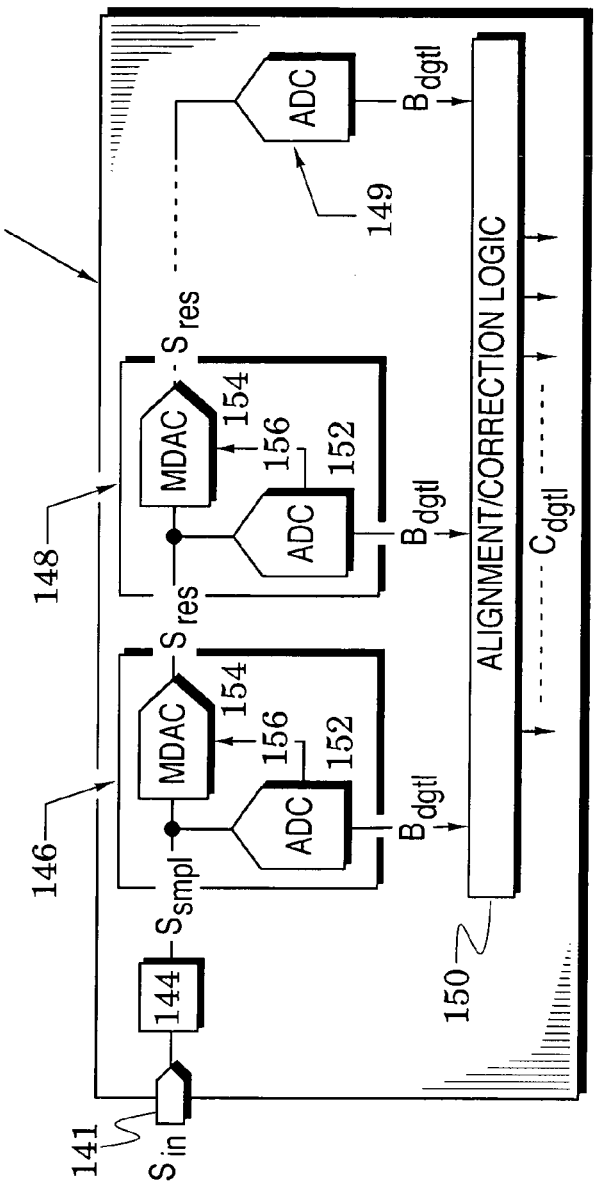
FIG. 6

US 7,746,171 B2

AMPLIFIER NETWORKS WITH CONTROLLED COMMON-MODE LEVEL AND CONVERTER SYSTEMS FOR USE THEREWITH

BACKGROUND OF THE INVENTION

1. Field of the Invention

The present invention relates generally to the control of amplifier common-mode levels.

2. Description of the Related Art

Differential amplifiers are used in a variety of signal conditioning systems (e.g., pipelined signal converters) to generate residue signals for conversion in successive converter stages to thereby provide digital codes that correspond to analog input signals. The accuracy of the residue signals and, hence, that of the signal conversion, is directly related to the performance of differential amplifiers which generally operate in first and second operational modes. It has been found, for example, that poorly controlled common-mode levels can substantially degrade the accuracy of residue signals.

BRIEF SUMMARY OF THE INVENTION

The present invention is generally directed to accurate control of amplifier common-mode levels. The drawings and the following description provide an enabling disclosure and the appended claims particularly point out and distinctly claim disclosed subject matter and equivalents thereof.

BRIEF DESCRIPTION OF THE DRAWINGS

FIG. 6 is a diagram of a signal converter system that can include any of the illustrated amplifier network embodiments; and FIGS. 7A and 7B illustrate operational modes in a multiplying digital-to-analog converter of the system of FIG. 6.

DETAILED DESCRIPTION OF THE INVENTION

The drawings illustrate structures that accurately control amplifier common-mode levels. This control is particularly suited for use in amplifier networks that operate in different amplifier modes such as those used in multiplying digital-to-analog converters to generate residue signals for processing in subsequent converter stages of signal converter systems. Accurate control of common-mode levels is enhanced with close attention to various amplifier functions (e.g., reduction of amplifier loading, accurate sensing of common-mode levels, mitigation of headroom restraints, and proper transistor biasing).

Figure 1:
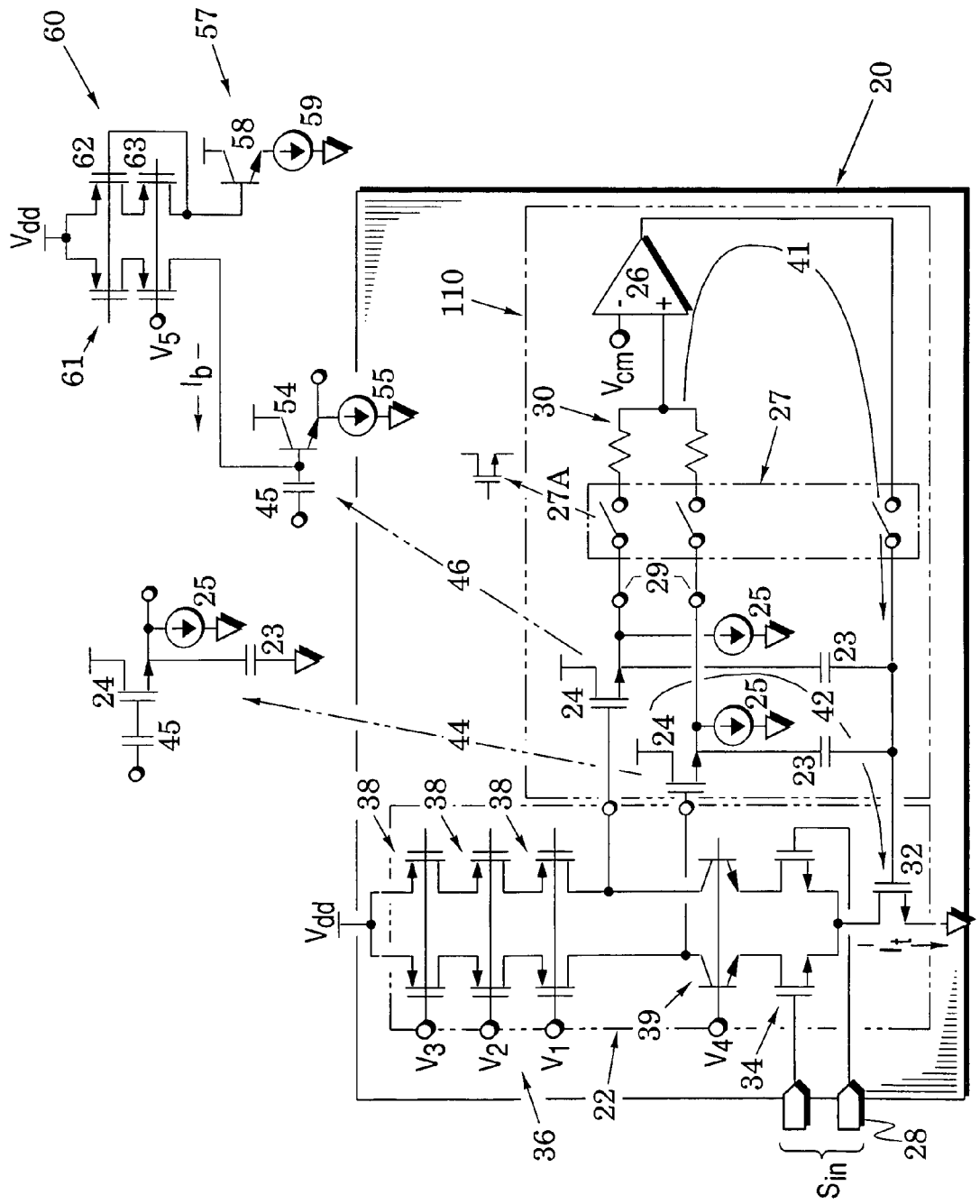
FIGS. 1 and 2 are schematics of amplifier network embodiments which have a controlled common-mode level.

In particular, FIG. 1 illustrates an amplifier network 20 that is suitable for processing an input signal to an output signal with a controlled common-mode level. The network includes a signal amplifier 22, hold capacitors 23, follower transistors 24, a differential amplifier 26, and a set 27 of switches. As evidenced by example arrow 27A, the switches 27 may be realized with transistors.

The signal amplifier 22 is configured to process input signals at an input port 28 to output signals centered about a common-mode level which is a function of a common-mode control signal. The hold capacitors 23 are provided to hold the common-mode level at the output of the signal amplifier and the follower transistors 24 are inserted to provide isolation between the signal amplifier 22 and the hold capacitors.

Current through the follower transistors 24 is preferably set with current sources 25. In an network embodiment, a resistive voltage divider 30 is inserted across a pair of switches of the set 27 to sense the common-mode level of the signal at a common-mode port 29 across the hold capacitors 23. A tap point of the divider 30 is coupled to one input of the differential amplifier 26.

In a first operational mode, the switches of the set 27 are closed (in contrast to their positions in FIG. 1) to couple the differential amplifier 26 to receive the common-mode level from the common-mode port 29. The differential amplifier then provides the common-mode control signal in response to the difference between the common-mode level and a common-mode reference voltage $V_{cm}$ that is provided to the differential amplifier.

In a second operational mode, the switches of the set 27 are opened (as shown in FIG. 1) to isolate the hold capacitors from the differential amplifier 26. The hold capacitors maintain the common-mode level during this second operational mode. Because the switches of the set 27 are now open, amplifier parameters (e.g., gain and bandwidth) will not be adversely affected by the loading of non-amplifier structures (e.g., the resistive voltage divider 30). In addition, the impedance of the hold capacitors 23 is quite low at typical signal frequencies so that these capacitors complete a feedback control loop that has an extremely fast response time.

In contrast, the response time through the differential amplifier 26 is sufficient for refreshing the common-mode level during the first operational mode but it is generally not sufficient to maintain the common-mode level in response to rapidly-changing input signals during the second operational mode. As long as the time duration of the second operational mode is short relative to the time constant of the hold capacitors 23, the common-mode level will be substantially maintained throughout the second mode. The common-mode level is then refreshed during a subsequent first operational mode. In an exemplary use of the network 20, the first and second operational modes successively repeat at a system rate with signal flow through the amplifier 22 being provided during each of the second operational modes and the common-mode level of the amplifier being refreshed during each of the first operational modes.

In a network embodiment, the amplifier 22 is formed with a tail-current transistor 32, a differential pair 34 of transistors, and an active load 36. The tail-current transistor provides a tail current $I_t$ in response to a gate signal and the differential pair steers the tail current across the active load in response to input signals to thereby generate the amplifier's output signals at the inputs of the follower transistors 24. To enhance the amplifier's gain, the active load 36 preferably includes one or more pairs 38 of current-source transistors that each respond to a bias voltage (e.g., $V_1$-$V_3$).

The output impedance of the differential pair 34 can be enhanced with cascode transistors 39 that are inserted between the differential pair and the active load 36. The cascode transistors respond to a bias voltage (e.g., $V_4$) and the enhanced output impedance further enhances the gain of the differential pair 34.

The common-mode level at the output of the cascode transistors 39 varies with the amplitude of the tail current $I_t$ because this current generates a voltage drop across the active load 36. Accordingly, the gate voltage of the tail-current transistor 32 is the common-mode control signal and the common-mode level can be adjusted during the first operational mode along a first control loop 41 when the differential amplifier 26 varies this gate signal in response to the difference between the common-mode level and the common-mode reference voltage $V_{cm}$. In the second operational mode, the gate signal is controlled through a second control loop 42 that is completed through the hold capacitors 23. The second control loop 42 is significantly faster than the first control loop 41.

Introduction of the transistor followers 24 significantly reduces the loading of the hold capacitors 23 that would otherwise be imposed on the amplifier 22 with consequent degradation of its performance. Although the common-mode level at the output of the follower transistors 24 differs from the common-mode level at the output of the cascode transistors 39 (e.g., by the gate-to-source voltage $V_{gs}$ if the transistor followers are metal-oxide-semiconductor (MOS) transistors), this difference can be factored into the common-mode reference voltage $V_{cm}$ that is provided to the differential amplifier. It is noted that this difference is a function of the current amplitude that is demanded by the current sources 25.

As indicated by embodiment arrow 44, level-shift capacitors 45 can be inserted between the amplifier 22 and each of the follower transistors 24 which are shown as metal-oxide-semiconductor transistors. Each level-shift capacitor 45 and its corresponding hold capacitor 23 form a capacitive divider so that the common-mode level at the output of the cascode transistors 39 is higher than the common-mode level at the top of the hold capacitors. Since the latter level is controlled to substantially equal the common-mode reference voltage $V_{cm}$, the level at the output of the cascode transistors 39 will be urged upward to a different level. The difference between the two levels will also include the voltage across the transistor followers 24 (e.g., the gate-to-source voltage $V_{gs}$). This adjustment of common-mode levels is especially helpful when accommodating amplifier structures to systems with limited headroom.

As indicated by embodiment arrow 46, the transistor followers 24 can be altered from MOS transistors to bipolar junction transistors 54 which are biased with current sources 55. In this network embodiment, a current source 57 is formed with another bipolar junction transistor 58 and associated current source 59 and the base current of the transistor 58 is mirrored by a current mirror 60 to provide a base current $I_b$ to the emitter follower 54.

To better accommodate limited headroom, the current mirror 60 is preferably arranged as a low-voltage cascode current mirror. That is, a cascoded pair 61 of transistors provides the base current $I_b$ and they are gate-coupled to a second pair of transistors 62 and 63. The cascoded pair 61 presents a high impedance to the base of the emitter follower 54. The gate of the transistor 62 is coupled to the base of the transistor 58 and the transistor 63 is coupled between the drain and gate of the transistor 62. These two transistors are comparatively sized so that they only insert two overdrive voltages between the base of transistor 58 and the supply voltage $V_{dd}$ when the gate of transistor 63 receives an appropriate bias voltage $V_5$.

Figure 2:
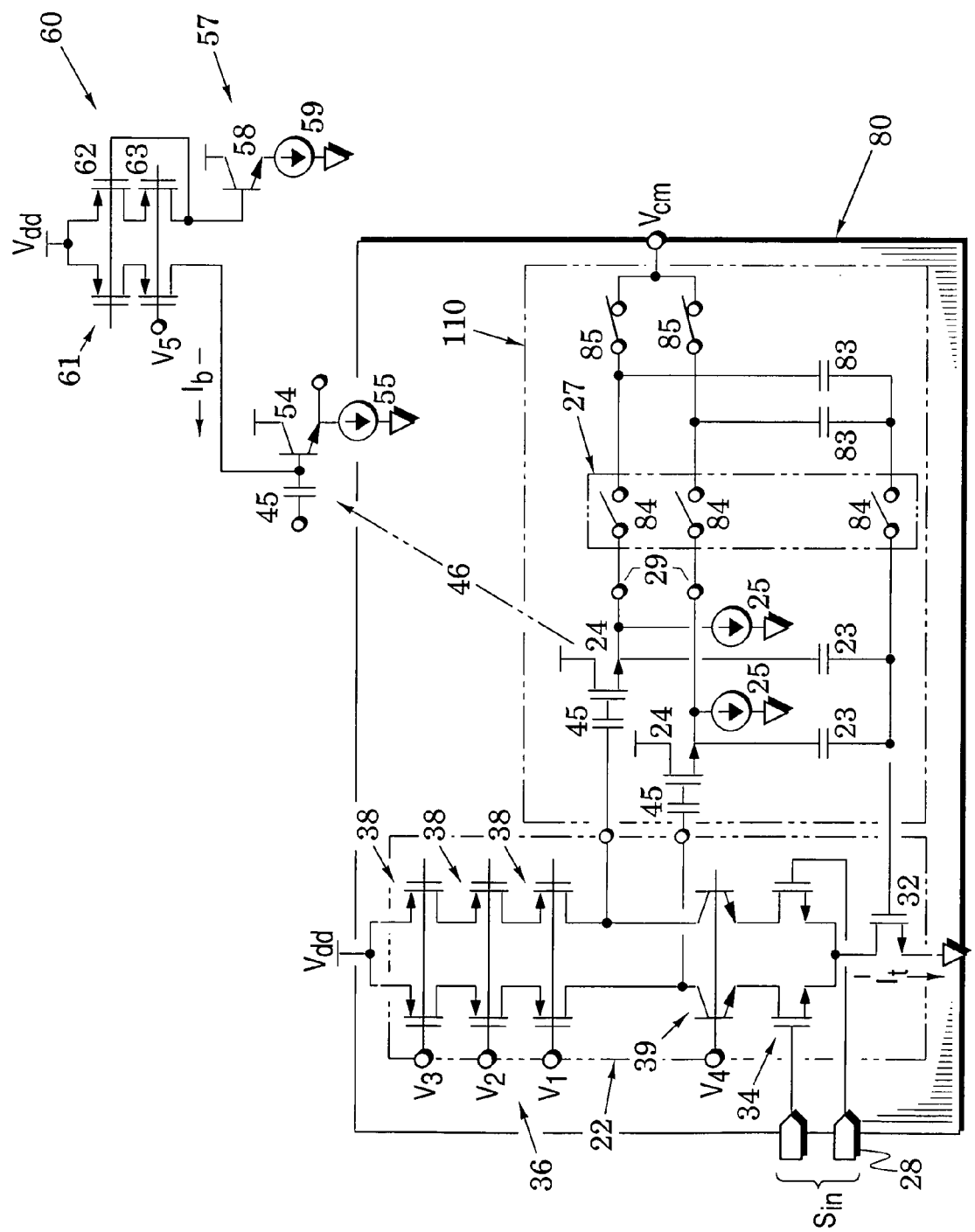

FIG. 2 illustrates another amplifier network embodiment 80 which includes elements of the embodiment 20 with like elements indicated by like reference numbers. In contrast, however, the network 80 replaces the closed-loop feedback structure of the network 20 with an open-loop structure formed by arranging the set 27 to serve as transfer switches 84 between the common-mode port 29 and refresh capacitors 83. Refresh switches 85 are positioned to couple the refresh capacitors 83 to receive the common-mode reference voltage $V_{cm}$.

In a first operational mode of the amplifier network 80, the transfer switches 84 are closed and the refresh switches 85 are open (i.e., opposite to the states shown in FIG. 2) so that a voltage previously inserted into the refresh capacitors 83 is substantially transferred to the hold capacitors 23. In a second operational mode, the transfer switches 84 are opened so that the hold capacitors 23 are isolated from the refresh capacitors 83. Meanwhile, the refresh switches 85 are closed to couple the refresh capacitors 83 to the common-mode reference voltage $V_{cm}$.

In these successive modes, the refresh capacitors 83 alternately receive charges from the common-mode reference voltage $V_{cm}$ and transfer charges to the hold capacitors 23. The common-mode reference voltage $V_{cm}$ is preferably provided with a low impedance so that the refresh capacitors are fully charged to this voltage during the second operational mode. The comparative sizing of the hold and refresh capacitors can be adjusted so that the hold capacitors are substantially charged to common-mode reference voltage $V_{cm}$ during the first operational mode.

In an exemplary use of the network 80, the first and second operational modes successively repeat at a system rate with signal flow through the amplifier 22 being provided during each of the second operational modes and the common-mode operational level being refreshed during each of the first operational modes.

The transistor followers 24 significantly reduce the loading of the hold capacitors 23 that would otherwise be imposed on the amplifier 22 with consequent degradation of its performance. In addition, the level-shift capacitors 45 facilitate adjustment of the common-mode level at the output of the cascode transistors 39. As described above relative to FIG. 1 (and as indicated by embodiment arrow 46), the transistor followers 24 can be realized with emitter followers 54 which can be biased with a base current $I_b$ that is obtained from a current mirror 60 which mirrors the current of a current source 57.

Figure 3:
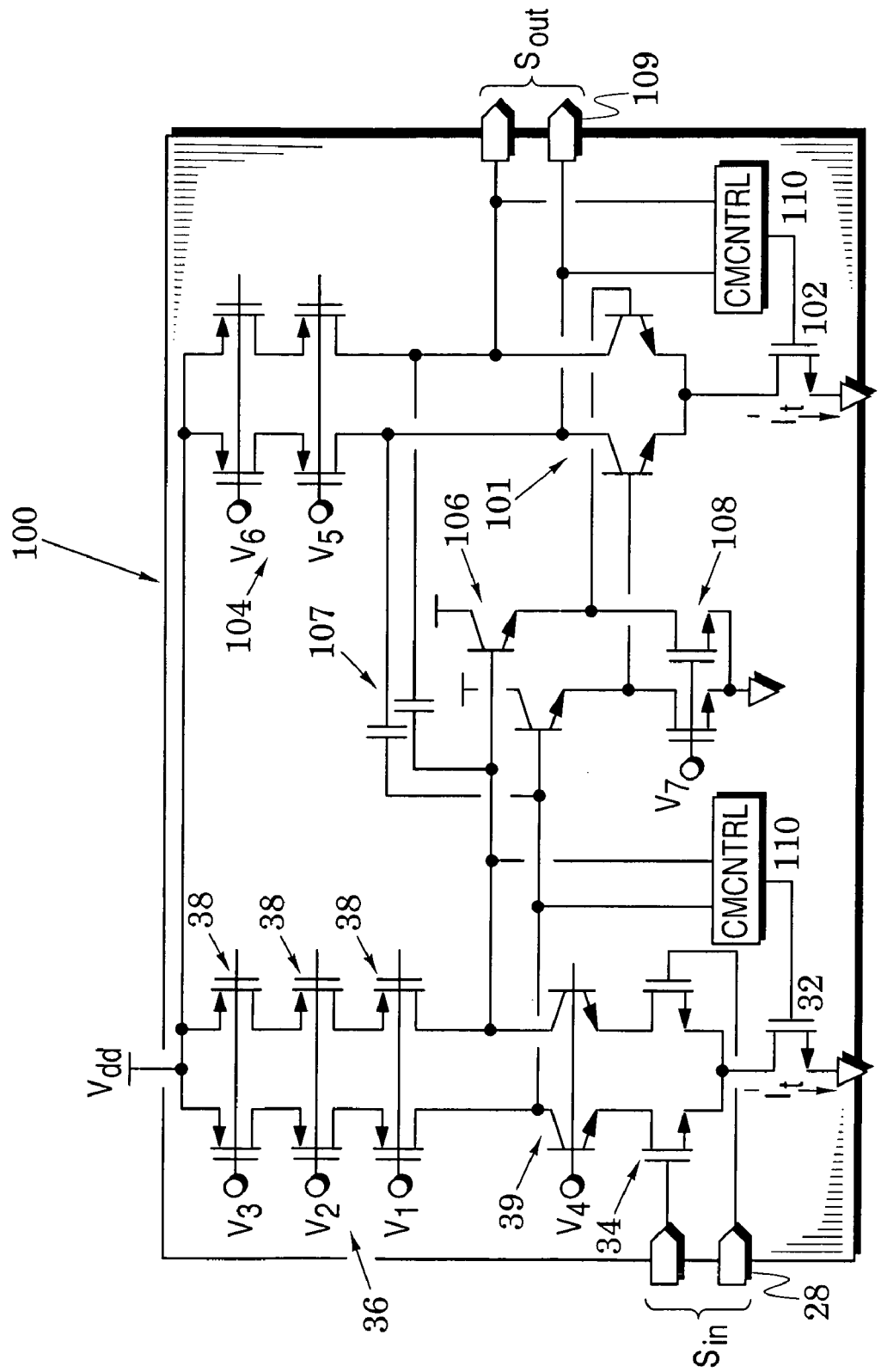
FIG. 3 is a schematic of a two-stage amplifier network that illustrates applications of common-mode control embodiments.

FIG. 3 illustrates a two-stage amplifier network 100 which can effectively use common-mode control embodiments of FIGS. 1 and 2. The network 100 includes elements of FIGS. 1 and 2 with like elements indicated by like reference numbers. In addition, the network 100 includes an output stage formed with a differential pair 101 of bipolar junction transistors positioned between a tail-current transistor 102 and an active load 104 formed with current-source transistors that receive bias voltages $V_5$ and $V_6$.

Bipolar junction transistor buffers 106 are arranged to drive the differential pair 101 in response to the cascode transistors 39 of the input stage which also includes the differential pair 34 and the active load 36. Emitters of the buffers 106 are biased with current-source transistors 108 that receive a bias voltage $V_7$. In addition, Miller-compensation capacitors 107 are coupled between the output of the differential pair 101 and the input of the buffers 106. These capacitors enhance stability when the network is embedded in a feedback loop by moving a dominant pole of the amplifier network 100 downward in frequency.

The output signal of the two-stage network 100 is delivered at an output port 109 that is coupled to the collectors of the differential pair 101. The common-mode level of these collectors and/or the common-mode level of the collectors of the cascode transistors 39 of the first stage can be controlled with common-mode control (CMCNTRL) structures 110. In the first stage, these structures are coupled between the output of the cascode transistors 39 and the gate of the tail-current transistor 32. In the second stage, these structures are coupled between the output of the differential pair 101 and the gate of the tail-current transistor 102. In various network embodiments, the CMCNTRL structures 110 of FIG. 3 can be realized with structures within the broken-line CMCNTRL blocks 110 that are shown in FIGS. 1 and 2.

Figure 4:
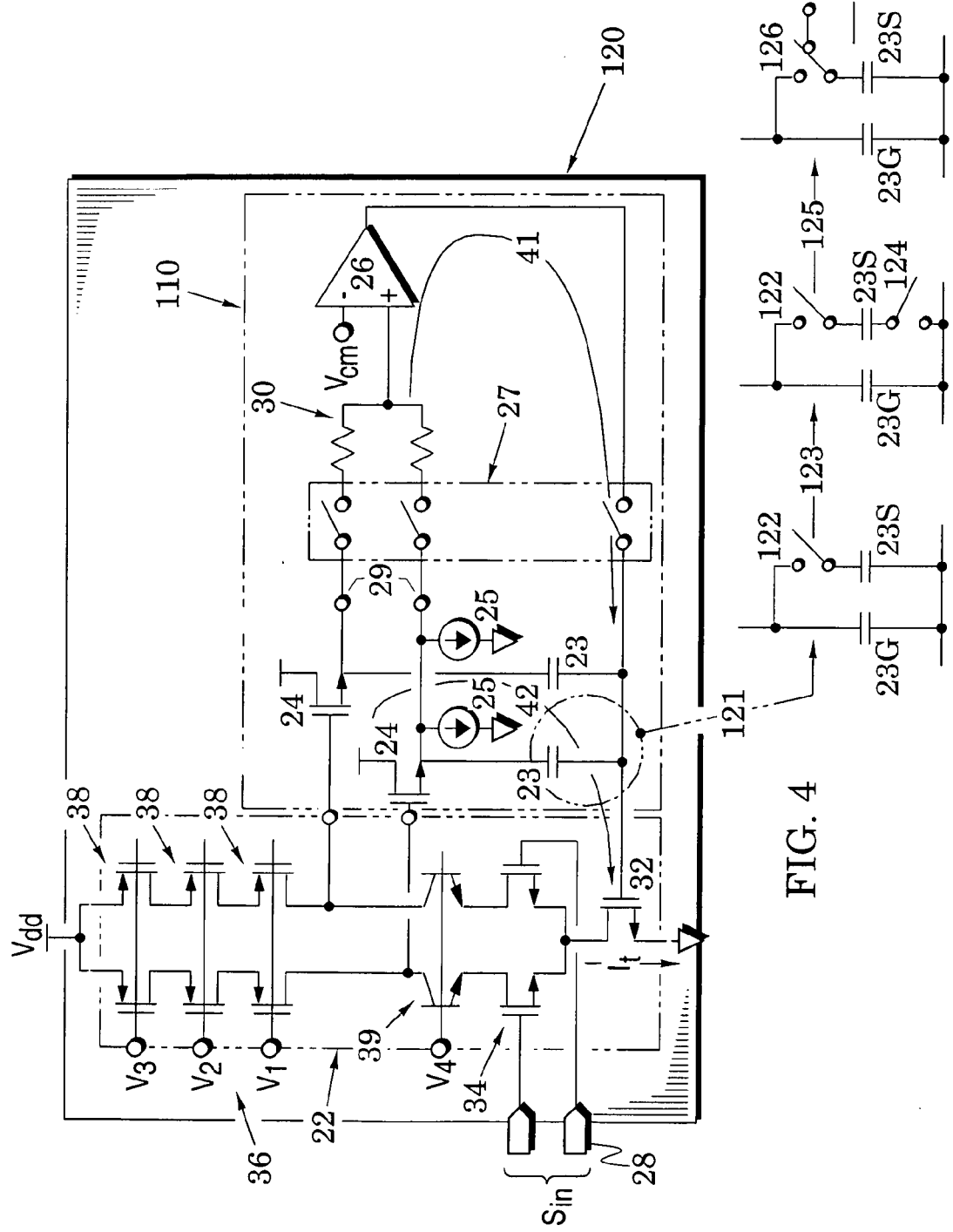
FIG. 4 is a schematic of other amplifier network embodiments with a controlled common-mode level.

FIG. 4 illustrates another amplifier network embodiment 120 which includes elements of the embodiment 20 of FIG. 1 with like elements indicated by like reference numbers. In contrast, however, the network 120 may include different embodiments of the hold capacitors 23. These embodiments are indicated by a substitution arrow 121 which leads away from an exemplary one of the hold capacitors. They provide further examples of the CMCNTRL structures 110 which were shown in FIGS. 1 and 2. Various of these CMCNTRL structures 110 can be used in the amplifier networks of FIGS. 3 and 5.

An important application of the amplifier network embodiments will be subsequently described with reference to FIGS. 6, 7A and 7B and in that description, the first and second operational modes described above are respectively termed sample and gain operational modes. To conform to that language, the arrow 121 indicates that the hold capacitor 23 may be formed with a hold capacitor 23G that is used in the second or gain mode and that a hold capacitor 23S is added to the hold capacitor 23G in the first or sample mode.

The first and second control loops 41 and 42 were introduced in FIG. 1 and are shown again in FIG. 4. As previously noted, the second control loop 42 is substantially faster (i.e., has a wider bandwidth) than the first control loop. Although the feedback amplitude and phase of both loops can be successfully stabilized with a single capacitor, the use of different capacitors permits the shaping of the feedback amplitude and phase to be tailored for each loop. Accordingly, a switch 122 is included so that the hold capacitor 23S is added to the capacitor 23G to obtain additional compensation in the sample mode. Substitution arrow 123 indicates another embodiment in which an additional switch 124 is inserted at the opposite end of the hold capacitor 23S for additional isolation during the gain mode.

Substitution arrow 125 indicates that the switch 122 can be replaced by a switch 126 which couples a plate of the hold capacitor 23S to the common-mode reference voltage $V_{cm}$ during the gain mode so that this capacitor is pre-charged to this voltage and introduces less loop disturbance when it is inserted during the sample mode. This reduction of loop disturbance can be further enhanced by inserting another switch 128 (as indicated by substitution arrow 127) which couples the opposite plate of the hold capacitor 23S to a reference voltage $V_{g32}$ which has been provided to closely approximate the voltage at the gate of the tail-current transistor 32. The hold capacitor 23S will now be pre-charged to the difference between the common-mode reference voltage $V_{cm}$ and the voltage at the gate of the tail-current transistor 32 (i.e., to the difference between the common-mode reference voltage $V_{cm}$ and the control signal) so that loop disturbance is further reduced when it is inserted during the sample mode.

Figure 5:
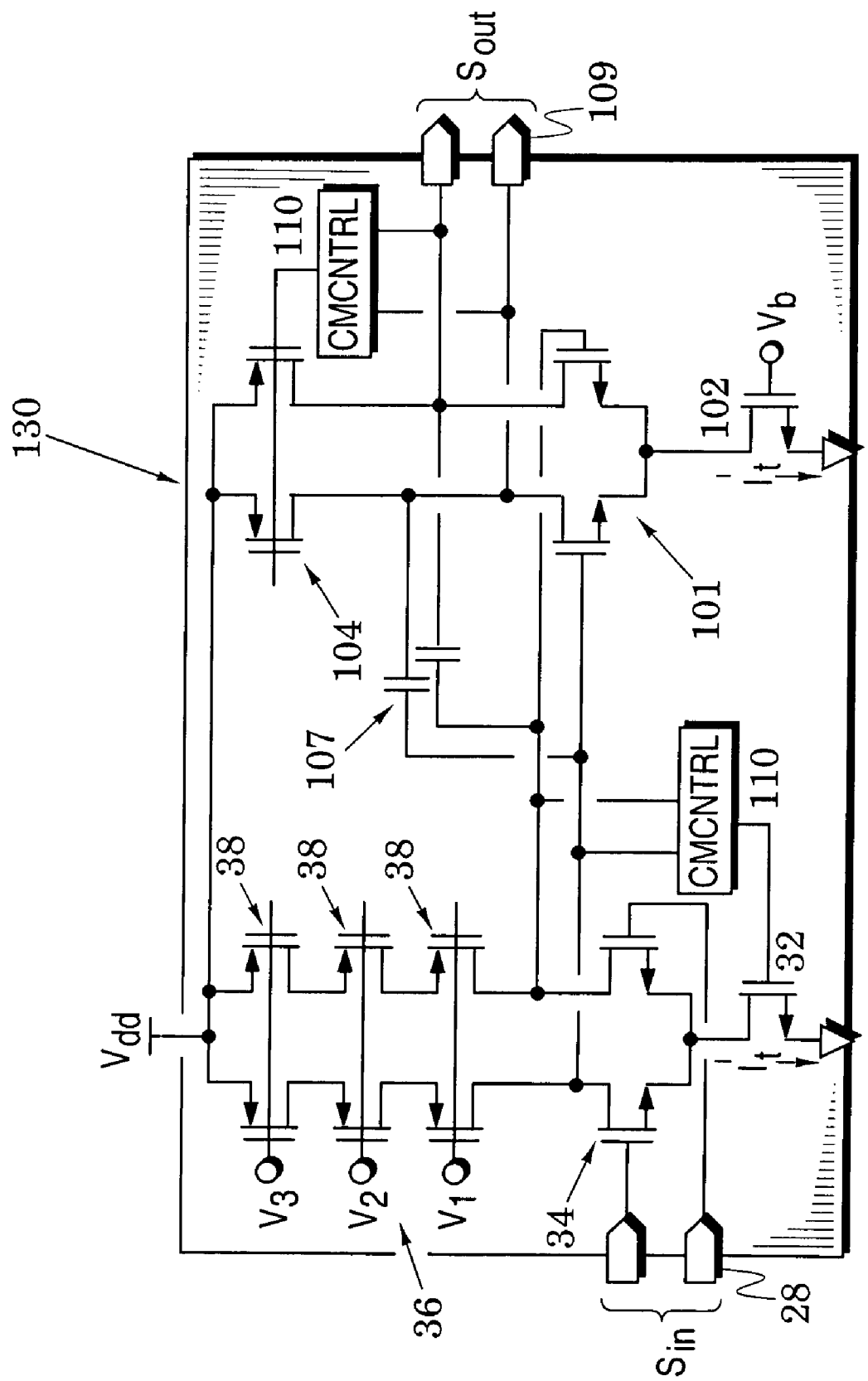
FIG. 5 is a schematic of another two-stage amplifier network that illustrates applications of common-mode control embodiments.

FIG. 5 illustrates another two-stage amplifier network 130 which is similar to the network 100 of FIG. 3 with like elements indicated by like reference numbers. The network 130 differs from the network 100 by removal of the cascode transistors 39, removal of the buffers 106, and removal of one stage of the active load 104 and by replacing the differential output pair 101 of bipolar junction transistors with a differential pair 131 of metal-oxide-semiconductor transistors.

In addition, the common-mode control structure 110 in the output stage is now coupled to control the common-mode level of the sources of differential pair 131 by adjusting the gate voltage of the active load 104 rather than by adjusting the gate voltage of the tail-current transistor 102 as was done in the amplifier network 100 of FIG. 3. Therefore, the active load's gate voltage is now the common-mode control signal (in FIGS. 1 and 2, this would require that the inputs to the differential amplifier 26 be switched to thereby maintain negative feedback around the control loop). The altered amplifier network 130 is particularly suited to permit lowering of the supply voltage $V_{dd}$ (e.g., from 3.3 volts to 1.8 volts) which can facilitate the use of a finer fabrication process (e.g., a 0.18 micron process rather than a 0.35 micron process).

The amplifier network embodiments of FIGS. 1-5 can be advantageously used in a variety of switched-capacitor systems such as multiplying digital-to-analog converters (MDACs) that are often included in signal conditioning systems. A system example is provided by the pipelined converter system 140 of FIG. 6 which includes a sampler 144, an initial converter stage 146 and at least one succeeding converter stage 148. The system 100 converts an analog input signal $S_{in}$ at an input port 141 to a corresponding digital code $C_{dgtl}$. This conversion is accomplished by successive (i.e., pipelined) conversions in the successive converter stages.

In particular, the sampler 144 provides a sample signal $S_{smpl}$ in response to the input signal $S_{in}$ and a respective pulse of a system clock and the initial converter stage 146 processes this sample to provide respective digital bits $B_{dgtl}$. The initial stage is also configured to provide a residue signal $S_{res}$ to a succeeding converter stage.

In similar fashion, each successive converter stage 148 processes a preceding residue signal $S_{res}$ to provide respective digital bits $B_{dgtl}$ and provide a respective residue signal $S_{res}$ to a succeeding converter stage. However, a final stage 149 only provides respective digital codes $B_{dgtl}$ as it has no need to provide a residue signal. Because these conversions are effected on successive clock pulses, they are temporally aligned in an alignment and correction logic 150.

The converter stages of the system are generally configured to provide extra digital bits so that the logic 150 can utilize them to eliminate conversion errors and generate the final digital code signal $C_{dgtl}$ that corresponds to the original sample. In other system embodiments, the sampler 144 may be eliminated and its function performed in the initial converter stage 106.

Converter stages other than the final stage 149 typically have an analog-to-digital converter (ADC) 152 (e.g., a flash ADC) that converts the sample signal $S_{smpl}$ to the respective digital bits $B_{dgtl}$. These stages also include an MDAC 154 that receives the sample signal $S_{smpl}$ (or residue signal $S_{res}$) and also receives a decision signal 156 from the ADC 152. The decision signal indicates which of possible digital bits is being provided at any given moment by the ADC 152. From these inputs, the MDAC generates a residue signal for further processing by subsequent stages.

FIGS. 7A and 7B show an MDAC embodiment 160 which has sample and output capacitors 161 and 162, first and second switches 163 and 164 and a differential amplifier 165 that drives an output port 166. The sample capacitor 161 has an upstream plate that is coupled to an input port 167 and to the second switch 164 and a downstream plate coupled to an inverting input of the differential amplifier 165. The output capacitor 162 is coupled about the differential amplifier 165. An output switch 168 is coupled to the output of the differential amplifier.

In a sample operational mode of the MDAC 160 that is shown in FIG. 7A, the first switch 163 is closed so that an input signal passes along a signal path 170 and is received in the sample capacitor 161. During this mode, the output of the amplifier 165 is grounded via the output switch 168. Charges from the sample signal $S_{smpl}$ are thus captured in the sample capacitor 161.

In a succeeding gain operational mode that is shown in FIG. 7B, the first and output switches 163 and 168 are opened and the second switch 164 is moved in response to the decision signal (136 in FIG. 4) to thereby establish a signal path 171 that applies a selected one of reference voltages (e.g., top and bottom reference voltages $V_{reft}$ and $V_{refb}$) to the upper plate of the sample capacitor 161 to thereby move charges along the signal path 171. Charges are thus transferred from the sample capacitor to the output capacitor 162 to thereby generate the residue signal $S_{res}$ at the output port 166.

The various amplifier network embodiments illustrated in FIGS. 1-5 are especially suited for use in the differential amplifier 165 in FIGS. 7A and 7B. In particular, the structures within the broken-line CMCNTRL blocks 110 of FIGS. 1, 2 and 4 can accurately control common-mode voltage levels in the differential amplifier 165 during the sample and gain operational modes of FIGS. 7A and 7B. This control enhances the accuracy of the residue signal $S_{res}$ that is passed to a succeeding signal converter and this, in turn, enhances the accuracy of the digital code $C_{dgt}$ that is provided by the signal converter 120 of FIG. 4. The amplifier network embodiments of FIGS. 1-5 were described with reference to first and second operational modes. It is noted that these respectively correspond to the sample and gain modes which have been described above with reference to FIGS. 7A and 7B.

The embodiments described herein are exemplary and numerous modifications, variations and rearrangements can be readily envisioned to achieve substantially equivalent results, all of which are intended to be embraced within the spirit and scope of the invention as defined in the appended claims.

I claim:

1. An amplifier network to operate in first and second operational modes, comprising:
   a signal amplifier configured to process input signals to output signals centered about a common-mode level which is a function of a common-mode control signal;
   hold capacitors to hold said common-mode level;
   follower transistors inserted to provide isolation between said signal amplifier and said hold capacitors;
   a differential amplifier arranged to provide said control signal in response to the difference between said common-mode level and a common-mode reference voltage; and
   switches arranged to couple said differential amplifier to said common-mode level in said first operational mode and to isolate said differential amplifier in said second operational mode.

2. The network of claim 1, wherein said switches are transistors.

3. The network of claim 1, further including a resistive voltage divider inserted across said switches to provide said common-mode level to said differential amplifier.

4. The network of claim 1, further including level-shift capacitors inserted between said signal amplifier and said follower transistors.

5. The network of claim 1, wherein said hold capacitors comprise:
   a first hold capacitor;
   a second hold capacitor; and
   at least one switch arranged to couple said second hold capacitor in parallel with said first hold capacitor in said first operational mode and to isolate said second hold capacitor in said second operational mode.

6. The network of claim 1, wherein said hold capacitors comprise:
   a first hold capacitor;
   a second hold capacitor; and
   at least one switch arranged to couple said second hold capacitor in parallel with said first hold capacitor in said first operational mode and to couple said second hold capacitor to said common-mode reference voltage in said second operational mode.

7. The network of claim 1, wherein said hold capacitors comprise:
   a first hold capacitor;
   a second hold capacitor; and
   at least one switch arranged to couple said second hold capacitor in parallel with said first hold capacitor in said first operational mode and to couple said second hold capacitor between said common-mode reference voltage and said control signal in said second operational mode.

8. The network of claim 1, wherein said signal amplifier includes:
   a tail-current transistor to provide a tail current in response to said control signal;
   an active load; and
   a differential pair of transistors positioned to steer said tail current across said active load in response to said input signals.

9. The network of claim 8, further including cascode transistors inserted between said differential pair and said active load.

10. The network of claim 1, wherein said signal amplifier includes:
    a differential pair of transistors; and
    an active load which provides load currents to said differential pair in response to said control signal.

11. The network of claim 10, further including a tail-current transistor coupled to said differential pair.

12. An amplifier network to operate in first and second operational modes, comprising:
    a signal amplifier configured to process input signals to output signals centered about a common-mode level which is a function of a common-mode control signal;
    hold capacitors to hold said common-mode level;
    follower transistors inserted to provide isolation between said signal amplifier and said hold capacitors;
    refresh capacitors;
    refresh switches positioned to couple said refresh capacitors to receive charge from a common-mode reference voltage during said second operational mode; and
    transfer switches positioned to transfer charge from said refresh capacitors to said hold capacitors during said first operational mode to thereby generate said control signal.

13. The network of claim 12, further including level-shift capacitors inserted between said signal amplifier and said follower transistors.

14. The network of claim 12, wherein said signal amplifier includes:

a tail-current transistor to provide a tail current in response to said control signal;
an active load; and
load in response to said input signals.

15. The network of claim 14, further including cascode transistors inserted between said differential pair and said active load.

16. The network of claim 12, wherein said signal amplifier includes:
a differential pair of transistors; and
an active load which provides load currents to said differential pair in response to said control signal.

17. The network of claim 16, further including a tail-current transistor coupled to said differential pair.

18. A signal coverter system for converting analog input signals into corresponding digital codes, the system comprising:
a pipelined arrangement of converter stages that successively process said input signals to corresponding digital bits; and
an alignment/correction logic configured to process said digital bits into said digital codes wherein at least one of said stages includes a multiplying digital-to-analog coverter that provides a residue signal to a succeeding stage with the aid of an amplifier network that operates in first and second operational modes and includes:
a signal amplifier configured to process input signals to output signals centered about a common-mode level which is a function of a common-mode control signal;
hold capacitors to hold said common-mode level;
follower transistors inserted to provide isolation between said signal amplifier and said hold capacitors; and
a common-mode control structure arranged to control said common-mode level during first and second operational modes;
wherein said control structure includes:
a differential amplifier arranged to provide said control signal in response to the difference between said common-mode level and a common-mode reference voltage; and
switches arranged to couple said differential amplifier to said common-mode level in said first operational mode and to isolate said differential amplifier in said second operational mode.

19. A signal coverter system for converting analog input signals into corresponding digital codes, the system comprising:
a pipelined arrangement of coverter stages that successively process said input signals to corresponding digital bits; and
an alignment/correction logic configured to process said digital bits into said digital codes wherein at least one of said stages includes a multiplying digital-to-analog coverter that provides a residue signal to a succeeding stage with the aid of an amplifier network that operates in first and second operational modes and includes:
a signal amplifier configured to process input signals to output signals centered about a common-mode level which is a function of a common-mode control signal;
hold capacitors to hold said common-mode level;
follower transistors inserted to provide isolation between said signal amplifier and said hold capacitors; and
a common-mode control structure arranged to control said common-mode level during first and second operational modes;
wherein said control structure includes:
refresh capacitors;
refresh switches positioned to couple said refresh capacitors to receive charge from a common-mode reference voltage during said first operational mode; and
transfer switches positioned to transfer charge from said refresh capacitors to said hold capacitors during a second one of said operational modes to thereby generate said control signal.

* * * * *